United States Patent
Ota et al.

(10) Patent No.: US 6,522,539 B2
(45) Date of Patent: Feb. 18, 2003

(54) COOLING METHOD AND APPARATUS FOR AN ELECTRIC DEVICE

(75) Inventors: Shigemi Ota, Fujisawa (JP); Takashi Moriyama, Owariasahi (JP)

(73) Assignees: Hitachi, Ltd., Tokyo (JP); Hitachi Video and Information System, Ltd., Kanagawa (JP)

( * ) Notice: Subject to any disclaimer, the term of this patent is extended or adjusted under 35 U.S.C. 154(b) by 0 days.

(21) Appl. No.: 10/224,600

(22) Filed: Aug. 21, 2002

(65) Prior Publication Data

US 2002/0191376 A1 Dec. 19, 2002

Related U.S. Application Data

(63) Continuation of application No. 09/793,598, filed on Feb. 27, 2001.

(30) Foreign Application Priority Data

Feb. 28, 2000 (JP) ........................................ 2000-051340

(51) Int. Cl.[7] ................................................ H05K 7/20
(52) U.S. Cl. .................... 361/695; 361/687; 361/688; 361/690; 361/692; 361/694; 174/16.1; 165/80.3; 165/122
(58) Field of Search ................................ 361/687, 690, 361/692–695; 174/16.1, 16.3; 165/80.5, 104.33, 122; 454/184

(56) References Cited

U.S. PATENT DOCUMENTS

| | | | |
|---|---|---|---|
| 5,412,534 A | 5/1995 | Cutts et al. | |
| 5,493,474 A * | 2/1996 | Schkrohowsky et al. | ... 361/695 |
| 5,540,548 A | 7/1996 | Eberhardt et al. | |
| 5,793,610 A | 8/1998 | Schmitt et al. | |
| 6,031,717 A | 2/2000 | Baddour et al. | |
| 6,042,474 A | 3/2000 | Harvey et al. | |
| 6,071,082 A | 6/2000 | Lecinski et al. | |
| 6,108,203 A | 8/2000 | Dittus et al. | |
| 6,135,875 A | 10/2000 | French | |
| 6,463,997 B1 * | 10/2002 | Nicolai et al. | ............. 165/80.2 |

FOREIGN PATENT DOCUMENTS

JP        05-021978        1/1993

* cited by examiner

*Primary Examiner*—Boris Chervinsky
(74) *Attorney, Agent, or Firm*—Mattingly, Stanger & Malur, PC (57) ABSTRACT

A cooling apparatus is constructed wherein, a fan box is provided with a plurality of suction openings and exhaust openings formed on a suction main surface and an exhaust main surface opposite to each other, a plurality of fan units each comprising a multi-blade fan and a suction duct disposed in different positions in a inserting direction are alternately arranged in an axial direction of the multi-blade fan so as to be able to insert and drawn out, and the fan unit is configured so that a suction duct thereof operates as a suction passage for the multi-blade fans of the next fan unit by communicating a fan suction opening with the suction opening through the suction duct and communicating a fan exhaust opening with the exhaust opening.

9 Claims, 13 Drawing Sheets

COOLING METHOD AND APPARATUS FOR AN ELECTRIC DEVICE

This is a continuation application of U.S. Ser. No. 09/793,598, filed on Feb. 27, 2001.

BACKGROUND OF THE INVENTION

The present invention relates to cooling techniques and data processing techniques, particularly to techniques effectively applied to forced cooling or the like for small-sized and highly-integrated data processing apparatus such as servers or for general electronic devices.

A forced cooling technique using fans are general as a cooling system for electronic devices. In the technique, a case of using a multi-blade fan excellent in static pressure property becomes increased in order to cope with reduction of suction and exhaust areas attendant upon improvement of packaging density of components and reduction in size of electronic device casing.

In the case that the heat generation rate of an electronic device is high, it is required for enhancing the cooling ability to dispose a plurality of multi-blade fans in parallel.

However, since a multi-blade fan takes the air in from a direction of the rotational axis of rotary blades and blows it to a peripheral direction, when a plurality of multi-blade fans are disposed in parallel, it is required to make the distance between the neighboring fans large in order to ensure the suction area of each multi-blade fan. As a result, there is a technical problem that the mounting space in the axial direction of the multi-blade fans becomes large.

As a conventional cooling technique for an electronic device, for example, JP-A-5-21978 describes a technique in which there is provided two fans for a current using system and a standby system and a power supply device portion so as to avoid the operation stop of the electronic device due to the trouble of the cooling fan by operating the standby fan when the current using fan gets out of order.

However, in the technique disclosed by JP-A-5-21978, any attention is not paid for reducing the mounting space in the case of mounting a plurality of multi-blade fans or the like.

SUMMARY OF THE INVENTION

It is an object of the present invention to provide a cooling technique capable of enhancing the cooling ability by concentrated disposition of a plurality of multi-blade fans in a smaller disposition space.

It is another object of the present invention to provide a cooling technique capable of suppressing considerable reduction of the cooling ability due to stop of a specific multi-blade fan in a concentrated disposition construction of a plurality of multi-blade fans which are operated always.

It is another object of the present invention to provide a cooling technique capable of exchanging an arbitrary multi-blade fan in a cooling apparatus comprising a plurality of multi-blade fans without stopping the operation of the cooling apparatus and without considerably reducing the cooling ability.

It is another object of the present invention to provide a cooling technique capable of exchanging an arbitrary multi-blade fan in a cooling apparatus comprising a plurality of multi-blade fans irrespective of disposition posture of the cooling apparatus.

It is another object of the present invention to provide a data processing apparatus capable of realizing reduction in size of the whole casing including a cooling apparatus.

It is another object of the present invention to provide a data processing apparatus capable of continuously operating irrespective of maintenance work for a cooling apparatus.

According to the present invention, there is provided a cooling method comprising the steps of disposing a plurality of multi-blade fans in parallel so that a suction opening of each multi-blade fan is alternately arranged with respect to the suction opening of the next multi-blade fan; connecting an exhaust opening of each multi-blade fan to a partition wall for dividing a suction side of the multi-blade fans from an exhaust side thereof; and operating all the multi-blade fans always.

According to one aspect of the present invention, there is provided a cooling apparatus of the comprising a plurality of multi-blade fans disposed in parallel so that a suction opening of each multi-blade fan is alternately arranged with respect to the suction opening of the next multi-blade fan, all the multi-blade fans being operated always; and a partition wall dividing a suction side of the multi-blade fan from an exhaust side thereof.

According to another aspect of the present invention, there is provided a cooling apparatus comprising a fan box having a plurality of suction opening portions and exhaust opening portions which are opened in a suction main surface and an exhaust main surface respectively, the surfaces being opposite to each other; and a first fan unit and a second fan units, each unit comprising a multi-blade fan always operated and a suction duct communicating a suction opening of the multi-blade fan of the next fan unit with the suction opening portion of the fan unit, the multi-blade fan and the suction duct being disposed in different positions respectively in an inserting direction of the units with respect to the fan box, wherein an exhaust opening of the multi-blade fan is connected to the exhaust opening portion.

According to still another aspect of the present invention, there is provided a data processing apparatus comprising a first casing; at least an external storage unit and a power supply unit mounted within the first casing; and a cooling apparatus mounted within the first casing, comprising a plurality of multi-blade fans disposed in parallel so that a suction opening of each multi-blade fan is alternately arranged with respect to the suction opening of the next multi-blade fan, all the multi-blade fans being operated always, and a partition wall dividing a suction side of the multi-blade fan from an exhaust side thereof.

According to further aspect of the present invention, there is provided a data processing apparatus comprising a first casing; at least an external storage unit and a power supply unit mounted within the first casing; and a cooling apparatus mounted within the first casing, comprising a fan box having a plurality of suction opening portions and exhaust opening portions which are opened in a suction main surface and an exhaust main surface respectively, the surfaces being opposite to each other, and a first fan unit and a second fan units, each unit comprising a multi-blade fan always operated and a suction duct communicating a suction opening of the multi-blade fan of the next fan unit with the suction opening portion of the fan unit, the multi-blade fan and the suction duct being disposed in different positions respectively in an inserting direction of the units with respect to the fan box, wherein an exhaust opening of the multi-blade fan is connected to the exhaust opening portion.

DETAILED DESCRIPTION OF THE PREFERRED EMBODIMENT

Hereinafter, an embodiment of the present invention will be described in detail with reference to the accompanying drawings.

Figure 15:
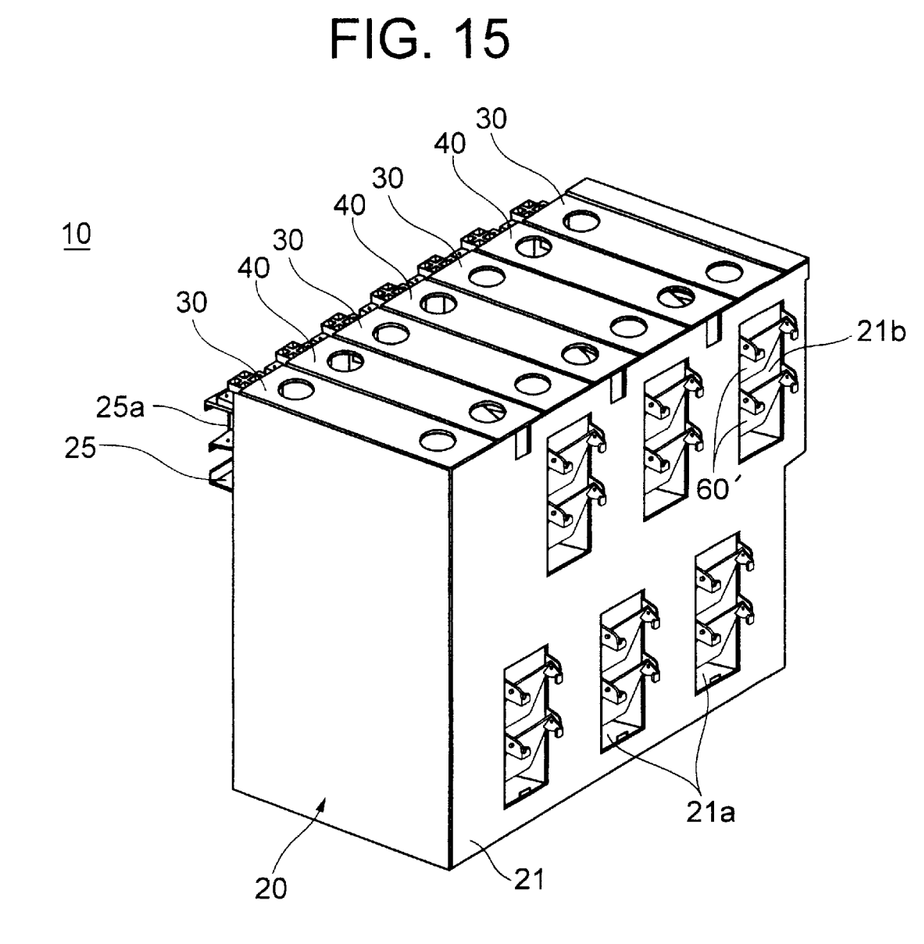
FIG. 15 is a perspective view showing an embodiment in which a check valve is provided on a suction opening side.

For example, the above embodiment describes an example in which the check valve 60 is disposed on the exhaust opening 22*a* (22*b*) side. However, it is also possible to construct the embodiment so that the check valve 60' is disposed on the suction opening 21*a* (21*b*) side. (See FIG. 15). FIG. 15 is a perspective view showing an embodiment in which a check valve is provided on a suction opening side.

The fan box 20 has a plurality of suction openings 21*a*, suction openings 21*b*, and exhaust openings 22*a*, and exhaust openings 22*b* which are different in positions in an inserting direction of the fan units 30 and 40, and are respectively opened on a suction main surface 21 and an exhaust main surface 22 which are opposite to each other in the inserting direction. In an arrangement direction of the fan units 30 and 40, a suction duct 23 communicating with the suction-opening 21*a* is provided on a side surface facing the fan unit 30 positioned at an end of the arrangement.

A terminal table 25 is provided at an insertion/drawn-out end of the fan units 30 and 40 in the fan box 20. In the terminal table 25, a plurality of power supply connectors 25*a* connected to a not-shown power supply are disposed in an arrangement direction of a plurality of fan units 30 so as to correspond to the arrangement intervals.

Figures 8A, 8B:
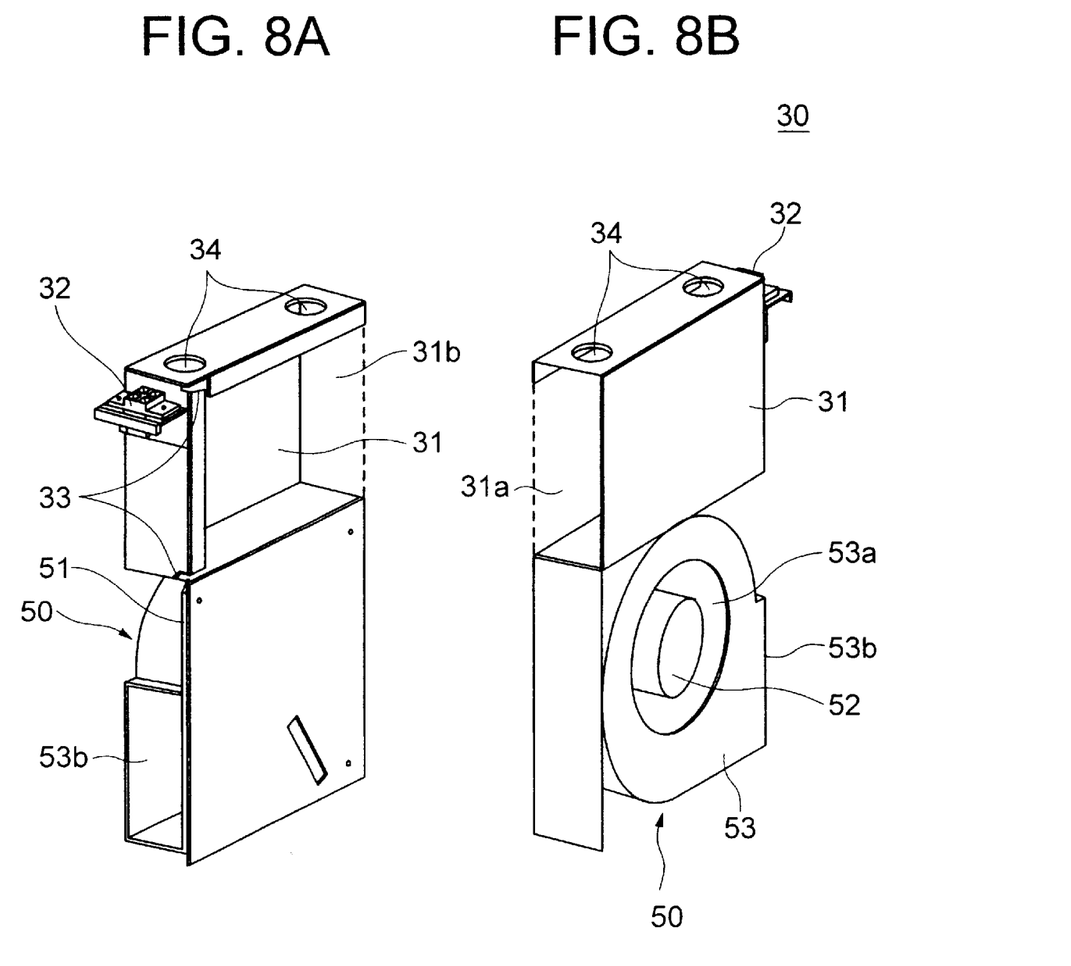
FIGS. 8A and 8B are perspective views showing a fan unit constituting the cooling apparatus according to the embodiment of the present invention, which are seen from the mutually opposite directions.

FIGS. 8A and 8B are perspective views of the fan unit 30 of this embodiment seen from the mutually reverse angles. In the fan unit 30 of this embodiment, a multi-blade fan 50 is disposed on the front end side (lower end side) in the inserting direction to the fan box 20, and a suction duct 31 is disposed on this side (upper end side). In this suction duct 31, a large opening portion 31*a* is opened in one side surface. The one side surface is a side surface facing the fan suction opening 53*a* of the multi-blade fan 50 shown in FIG. 10 held by another adjacent fan unit 40. The suction duct 31 is provided with a small opening portion 31*b* opened in a side surface on the suction opening 21*a* side of the box 20.

On this side (upper end side) in the inserting direction to the fan box 20 of the fan unit 30, a power supply connector 32, a power supply cable leading groove 33, and a working hole 34 for insertion/drawn-out are provided.

Figure 9A:
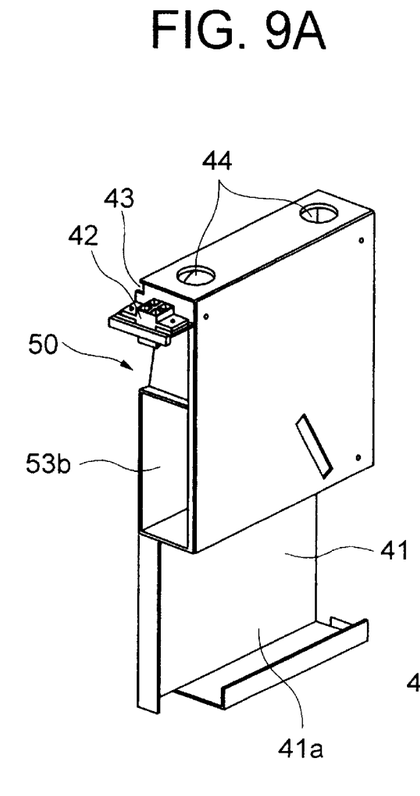
FIGS. 9A and 9B are perspective views showing a fan unit constituting the cooling apparatus according to the embodiment of the present invention, which are seen from the mutually opposite directions.
Figure 9B:
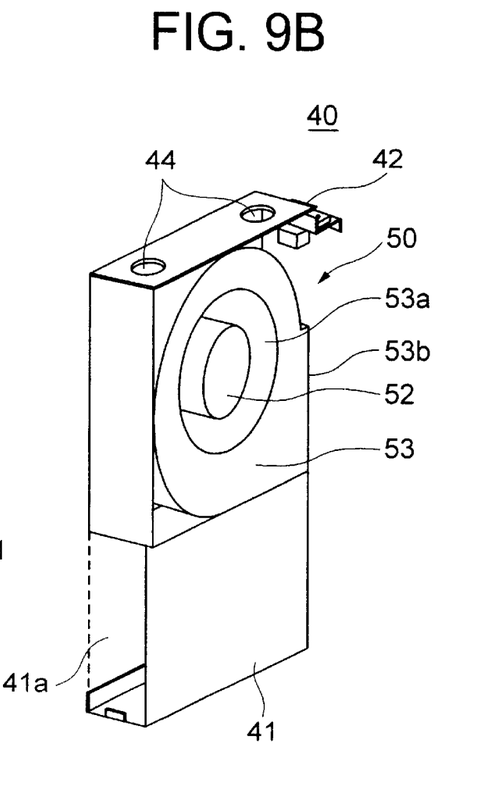

Similarly, FIGS. 9A and 9B are perspective views of the fan unit 40 of this embodiment seen from the mutually reverse angles. In the fan unit 40 of this embodiment, a multi-blade fan 50 is disposed on this side (upper end side) in the inserting direction to the fan box 20, and a suction duct 41 is disposed on the front end side (lower end side). In this suction duct 41, a large opening portion 41 is opened in one side surface. The one side surface is a side surface facing the fan suction opening 53*a* of the multi-blade fan 50 shown in FIG. 10 held by another adjacent fan unit 30. The suction duct 41 is provided with a small opening portion 41*b* opened in a side surface on the suction opening 21*a* side of the fan box 20.

On this side (upper end side) in the inserting direction to the fan box 20 of the fan unit 40, a power supply connector 42, a power supply cable leading groove 43, and a working hole 44 for insertion/drawn-out are provided.

Figure 10A:
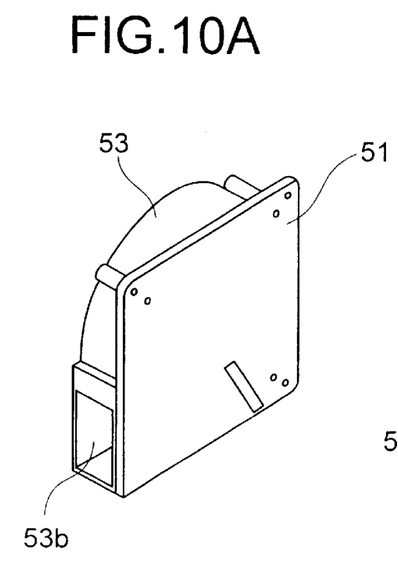
FIGS. 10A and 10B are perspective views showing a multi-blade fan held by the fan unit constituting the cooling apparatus according to the embodiment of the present invention, which are seen from the mutually opposite directions.
Figure 10B:
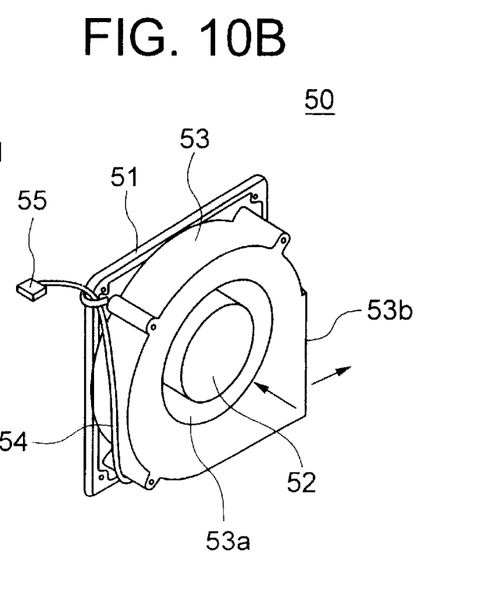

FIGS. 10A and 10B are perspective views seen from the mutually reverse angles of the multi-blade fan 50 held by each of the fan units 30 and 40. The multi-blade fan 50 of this embodiment comprises an attachment base 51, a rotary blade 52, a fan housing 53, a power supply cable 54, and a power supply connector 55. By rotation of the rotary blade 52, as shown by an arrow in FIG. 10B, air taken in from the fan suction opening 53*a* opened in the side surface in an axial direction of the fan housing 53 is discharged through the fan exhaust opening 53*b* opened in a peripheral direction of the fan housing 53.

In the fan unit 30, the multi-blade fan 50 is fixed via the attachment base 51, the power supply cable 54 is wired in a space in the suction duct 31 through the power supply cable leading groove 33, and the power supply connector 55 is connected to the power supply connector 32 on the fan unit 30 side.

In the fan unit 40, the multi-blade fan 50 is fixed via the attachment base 51, the power supply cable 54 is wired through the power supply cable leading groove 43, and the power supply connector 55 is connected to the power supply connector 42 on the fan unit 40 side.

That is, the multi-blade fan 50 held by each of the fan units 30 and 40 is attached to the fan unit 30 (40) in a posture that the fan suction opening 53a faces the reverse side of the large opening portion 31a (41a) of the suction duct 31 (41), and the fan exhaust opening 53b faces the reverse side of the small opening portion 31b (41b) of the suction duct 31 (41), at mutually different positions in the inserting direction to the fan box 20.

In this manner, the cooling apparatus 10 of this embodiment is constructed so that a plurality of fan units 30 and 40 each holding the multi-blade fan 50 are adjacently disposed in an axial direction with alternately shifting the position of the multi-blade fan 50 so as to use the suction duct 41 or the suction duct 31 of the mutually other fan unit 40 or 30, thereby suction in the axial direction of the multi-blade fan 50 of its own unit is performed. For this reason, an excess gap such as a suction duct in the arrangement space needs not be provided. Further, the dimension in an arrangement direction of the fan units can be considerably reduced in comparison with its cooling ability, and the large cooling ability by use of a plurality of multi-blade fans 50 in a smaller apparatus volume can be realized.

Next, the exhaust opening provided in the fan box 20 will be described.

Figure 11:
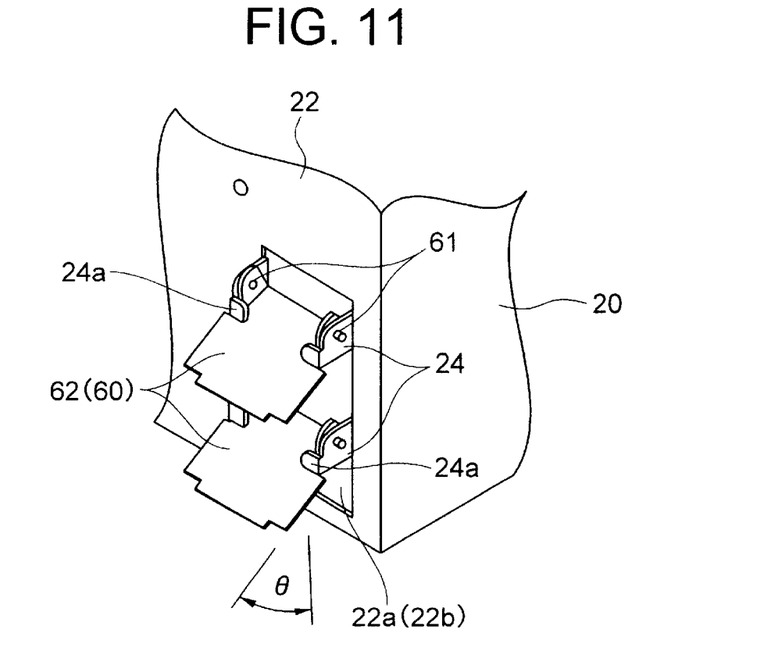
FIG. 11 is a perspective view showing an example of the construction of a check valve constituting the cooling apparatus according to the embodiment of the present invention.

In each of a plurality of exhaust openings 22a and exhaust openings 22b of the fan box 20, a check valve 60 is provided as exemplified in FIG. 11. This check valve 60 is constructed by a plurality of valve bodies 62 supported via a swing shaft 61 by a bearing piece 24 provided in each opening portion of the exhaust openings 22a and exhaust openings 22b of the fan box 20 such that both end portions can freely swing. Individual valve body 62 is made of a light resin, for example, having a sufficient stiffness to close the exhaust opening 22a and the exhaust opening 22b. In case of this embodiment, the bearing piece 24 is provided with a stopper piece 24a for restricting the opening angle θ of each of a plurality of valve bodies 62 within an acute angle.

As a result of this, in the check valve 60 of this embodiment, even if the fan box 20 of the attachment object is in any posture, a plurality of valve bodies 62 perform a check operation by moving in a direction to close the exhaust opening 22a (exhaust opening 22b) by a dynamic pressure of an air flow (hereinafter to be referred to as a counter air flow) counter flowing from an external space of the exhaust main surface 22 to the exhaust opening 22a (exhaust opening 22b) and by its own weight, or a dynamic pressure of the counter air flow. The check valve 60 provided in the exhaust opening 22b of the right end of FIG. 1 shows its closed state.

Besides, by the construction in which the opening/closing operation of individual exhaust valve 22a and exhaust valve 22b is performed by a plurality of valve bodies 62, more lightening is possible with keeping the stiffness of each valve body 62 in comparison with a single valve body. As a result, in each valve body, the responsibility of the closing operation by the dynamic pressure of the counter air flow is improved, and a sure closing operation can be realized.

Figure 1:
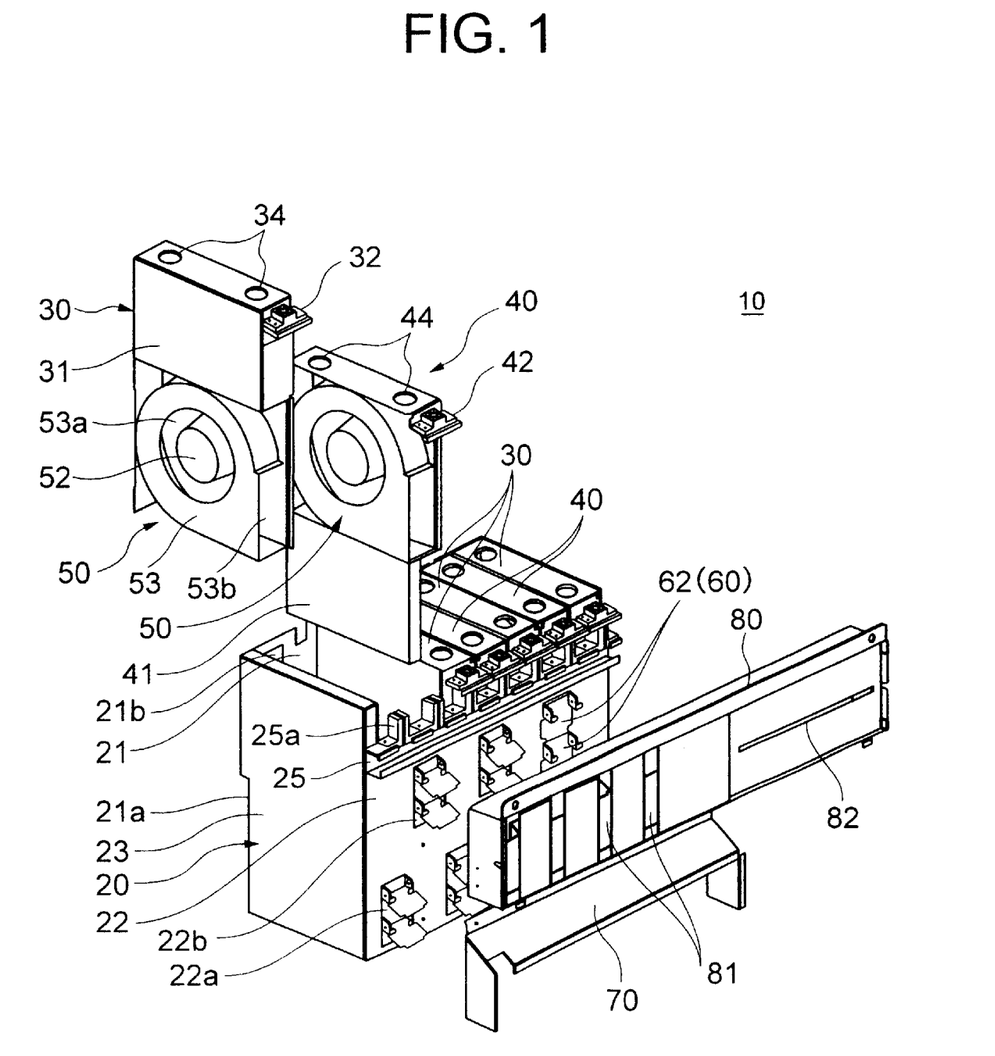
FIG. 1 is an exploded perspective view showing a construction of an embodiment of a cooling apparatus according to the present invention.
Figure 2:
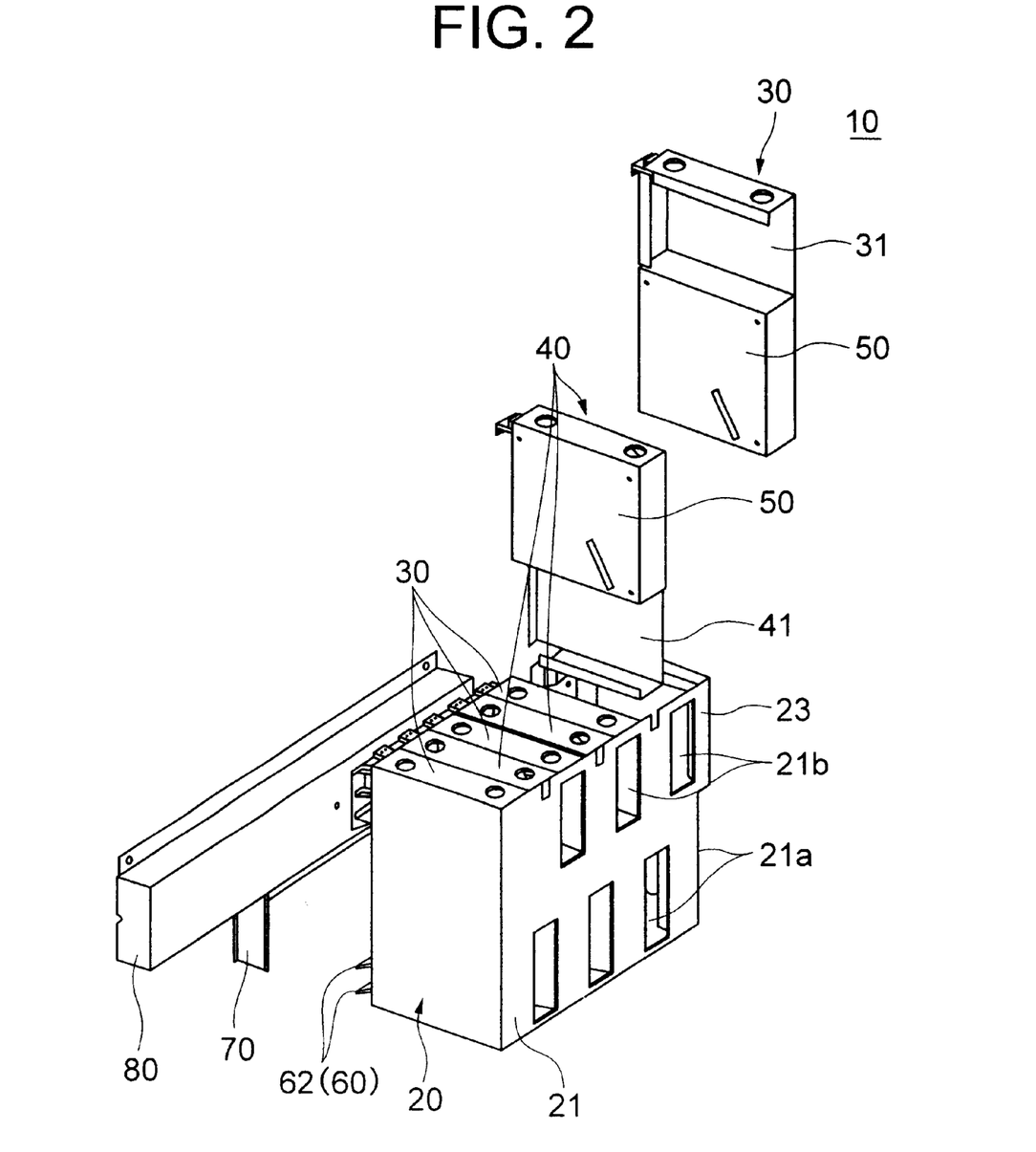
FIG. 2 is an exploded perspective view seen from the opposite direction of FIG. 1.
Figure 3:
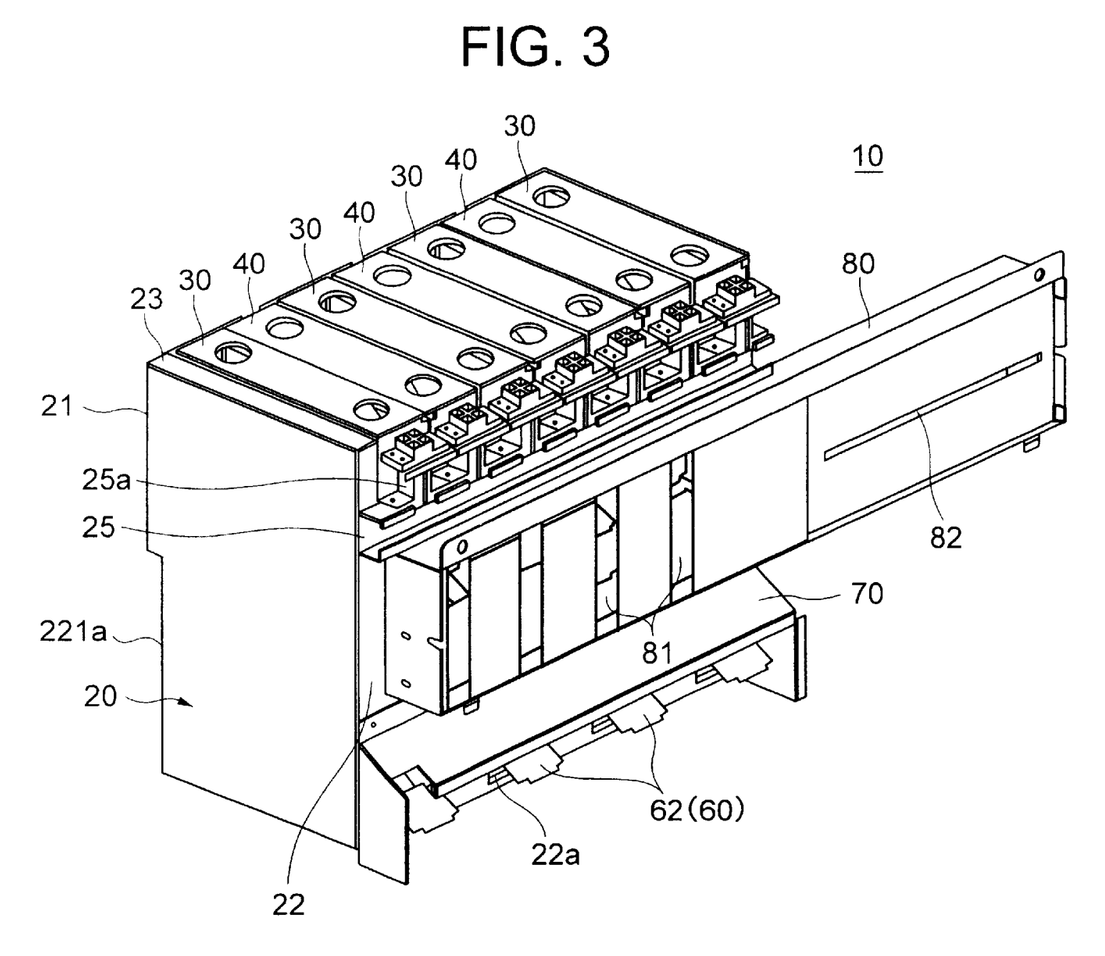
FIG. 3 is a perspective view showing an assembled condition of the embodiment of the cooling apparatus according to the present invention.
Figure 4:
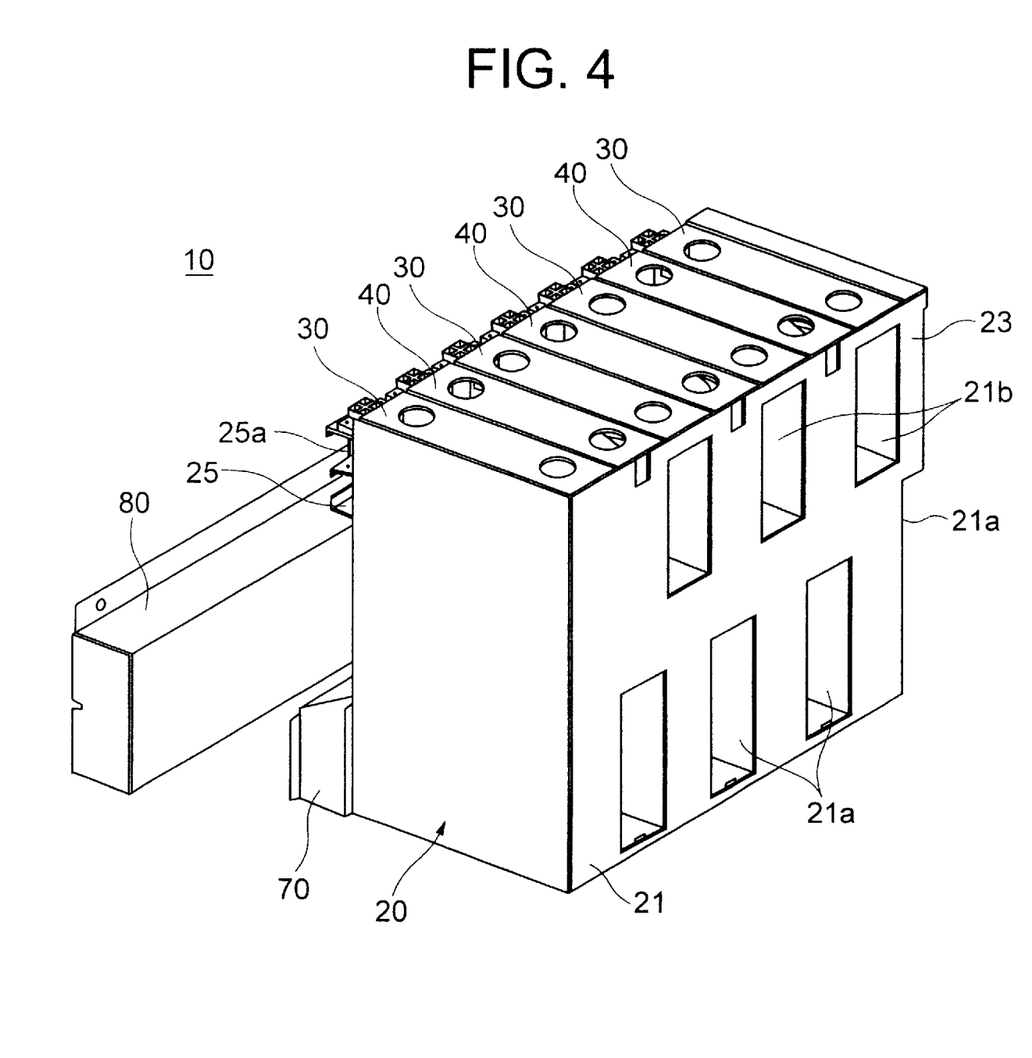
FIG. 4 is a perspective view showing the assembled condition seen from the opposite direction of FIG. 3.

As shown in FIG. 1, as occasion demands, a cooling duct 70 and a cooling duct 80 are connected to the exhaust opening 22a and the exhaust opening 22b on the exhaust main surface 22 side of the fan box 20. These cooling duct 70 and cooling duct 80 are provided for introducing exhaust air flows discharged from the exhaust opening 22a and the exhaust openings 22b to a cooling object.

First, these fan units 30 and 40 are fitted such that a plurality of fan units 30 and fan units 40 are alternately arranged to the fan box 20. By this construction, in the fan unit 30, the fan exhaust opening 53b of the multi-blade fan 50 disposed on the lower side becomes in fixed state to coincide with the exhaust opening 22a of the fan box 20. The fan suction opening 53a is in a communicated state with each suction opening 21a through the suction duct 41 (the suction duct 23 in the fan unit 30 at the left end of FIG. 1) facing the large opening portion 41a (but the suction duct 23 of the fan box 20 in the fan unit 30 at the left end of FIG. 1) of the suction duct 41 of the adjacent fan unit 40. When the power supply connector 32 of the fan unit 30 is connected to the power supply connector 25a on the terminal table 25 of the fan box 20, the multi-blade fan 50 held by the fan unit 30 is electrified to be in an operation state.

Similarly, in the fan unit 40, the fan exhaust opening 53b of the multi-blade fan 50 disposed on the upper side is in fixed state to coincide with the exhaust opening 22b of the fan box 20. The fan suction opening 53a is in a communicated state with each suction opening 21b through the suction duct 31 facing the large opening portion 31a of the suction duct 31 of the adjacent fan unit 30. When the power supply connector 42 of the fan unit 40 is connected to the power supply connector 25a on the terminal table 25 of the fan box 20, the multi-blade fan 50 held by the fan unit 40 is electrified to be in an operation state.

By such a construction, in the fan unit 30, air in the space outside the suction main surface 21 is sucked through the suction opening 21a and the suction duct 41 (the suction duct 23 in the fan unit 30 at the left end of FIG. 1) of the adjacent fan unit 40 into the fan suction opening 53a by an operation of the multi-blade fan 50, and after pressed and discharged through the fan exhaust opening 53b, the exhaust opening 22a, and the check valve 60 to the space (the interiors of the cooling duct 70 and the cooling duct 80) outside the exhaust main surface 22.

Similarly, in the fan unit 40, air in the space outside the suction main surface 21 is sucked through the suction opening 21a and the suction duct 31 of the adjacent fan unit 30 into the fan suction opening 53a by an operation of the multi-blade fan 50, and after being pressed, flows through the fan exhaust opening 53b and the exhaust opening 22b to forcedly open two valve bodies 62 of the check valve 60, and discharged as an exhaust air flow to the space (the interiors of the cooling duct 70 and the cooling duct 80) outside the exhaust main surface 22.

By such an air flow, the air pressure P2 of the space (in this case, the spaces in the cooling duct 70 and the cooling duct 80) outside the exhaust main surface 22 becomes larger than the air pressure P1 outside the suction main surface 21.

Here, if the multi-blade fan 50 of an arbitrary fan unit 30 or 40 is out of order and stopped or an arbitrary fan unit 30 or 40 is drawn out from the fan box 20 for maintenance or the like and electrifying the multi-blade fan 50 is stopped, the exhaust air flow through the check valve 60 is stopped. For this reason, by the differential pressure between the above-described air pressures P2 and P1, a counter air flow is produced. If it is left as it is, this counter air flow reaches the space outside the suction main surface 21 through the suction opening 21a or 21b, and an air flow circulating within the fan box 20 is formed by being sucked through the other suction opening 21a or 21b, besides, a reduction of the cooling ability is brought about by the reduction of the air pressure P2 on the exhaust main surface 22 side.

In contrast with this, in case of this embodiment, because the exhaust opening 22a and the exhaust opening 22b are each provided with the check valve 60, a plurality of valve bodies 62 of the check valve 60 of the exhaust opening 22a or the exhaust opening 22b corresponding to the fan unit 30 or 40 are autonomously closed by its own weight and the dynamic pressure of the above counter air flow, the counter air flow is stopped, and the reduction of the cooling ability due to the circulation of the counter air flow, the reduction of the air pressure P2 on the exhaust main surface 22 side, or the like can be prevented.

In this manner, in the cooling apparatus 10 of this embodiment, by the autonomous counter air flow stopping operation of the check valve 60, even if the multi-blade fan 50 of an arbitrary fan unit 30 or 40 is out of order and stopped, or an arbitrary fan unit 30 or 40 is drawn out from the fan box 20 for maintenance or the like, the reduction of the cooling ability due to the circulation of the counter air flow in the exhaust opening 22a or the exhaust opening 22b corresponding to the fan unit 30 or 40, the reduction of the air pressure P2 on the exhaust main surface 22 side, or the like can be prevented.

Accordingly, for example, the number of fan units 30 and 40 somewhat larger than the required cooling ability are mounted and it is constructed such that the cooling ability of the cooling apparatus 10 has a margin. By such a construction, even if an arbitrary multi-blade fan 50 is out of order in operation, it is avoided that a not-shown object device of the cooling object by the reduction of the cooling ability falls in operation stop. Besides, while the not-shown object device of the cooling object is in operation, it becomes possible to freely perform a maintenance by inserting and drawing out the fan units 30 and 40. For example, by applying the cooling device 10 of this embodiment as cooling means of a data processing apparatus such as a server which is designed on the assumption of a long-term nonstop operation, it becomes possible to realize the nonstop operation of the data processing apparatus such as the server.

Figure 12:
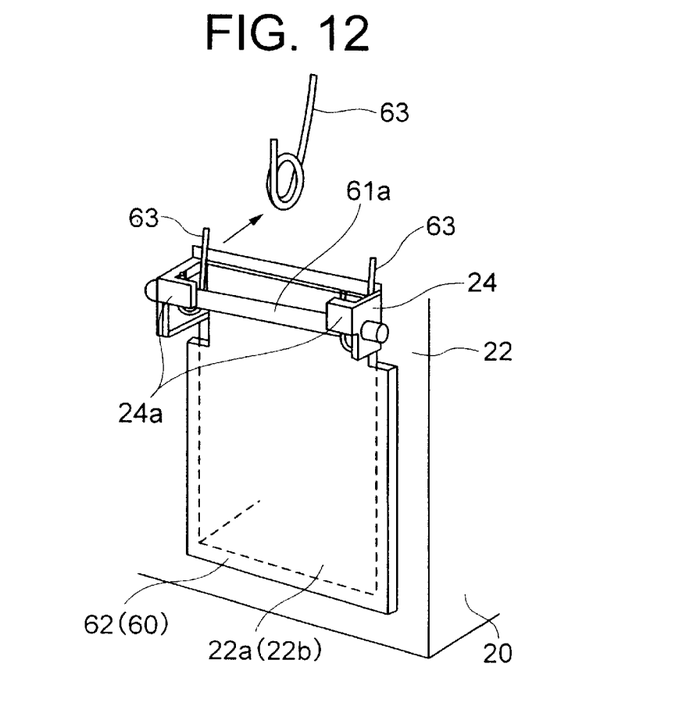
FIG. 12 is a perspective view showing a modification of the construction of the check valve constituting the cooling apparatus according to the embodiment of the present invention.

As for the check valve 60, as exemplified in FIG. 11 and so on, it is not limited to the construction in which the closing operation of the valve body is autonomously performed by its own weight or the dynamic pressure of the counter air flow, but, as exemplified in FIG. 12, it may have a construction in which the closing operation of the valve body is autonomously performed by a biasing force of a spring or the like. That is, in the example of FIG. 12, a coil spring 63 is fitted to a swing shaft 61a, and it is assembled in a state that one end of the coil spring 63 is in contact with the stopper piece 24a and the other end is in contact with the valve body 62a. Further, by the opening force of both ends of the coil spring 63, the swinging valve body 62a is always biased toward the closing direction. The bias force by this coil spring 63 is set at a value possible to close the valve body 62a against a rotational resistance or the like due to the own weight of the valve 62a in an arbitrary posture, or against friction of the swing shaft 61a in case that the valve body 62a easily opens by the dynamic pressure of an exhaust air flow produced from the exhaust opening 22a (22b) upon operation of the multi-blade fan 50 and there is no dynamic pressure of the exhaust air flow.

Figure 13:
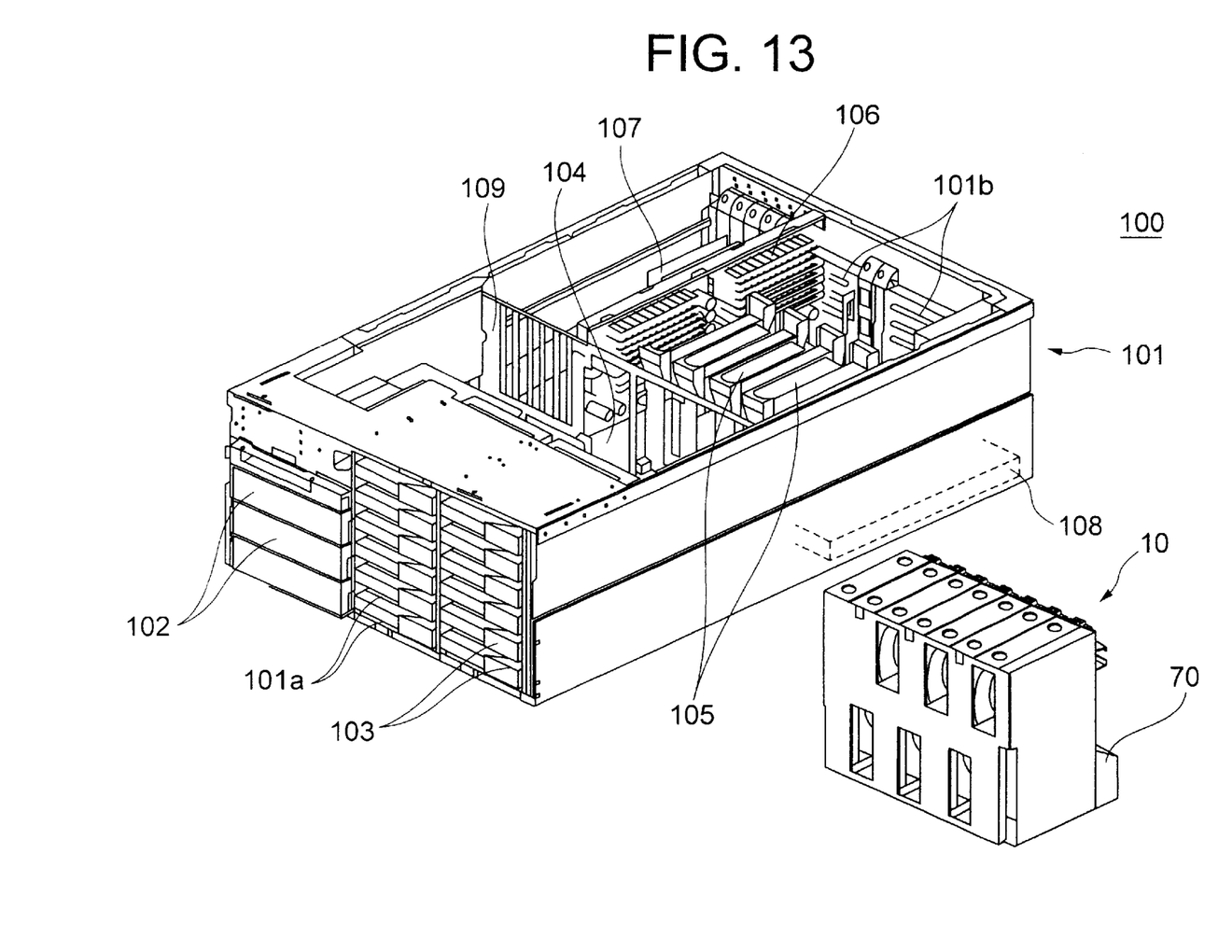
FIG. 13 is an exploded perspective view showing a constructive example of a data processing apparatus according to the embodiment of the present invention.
Figure 14:
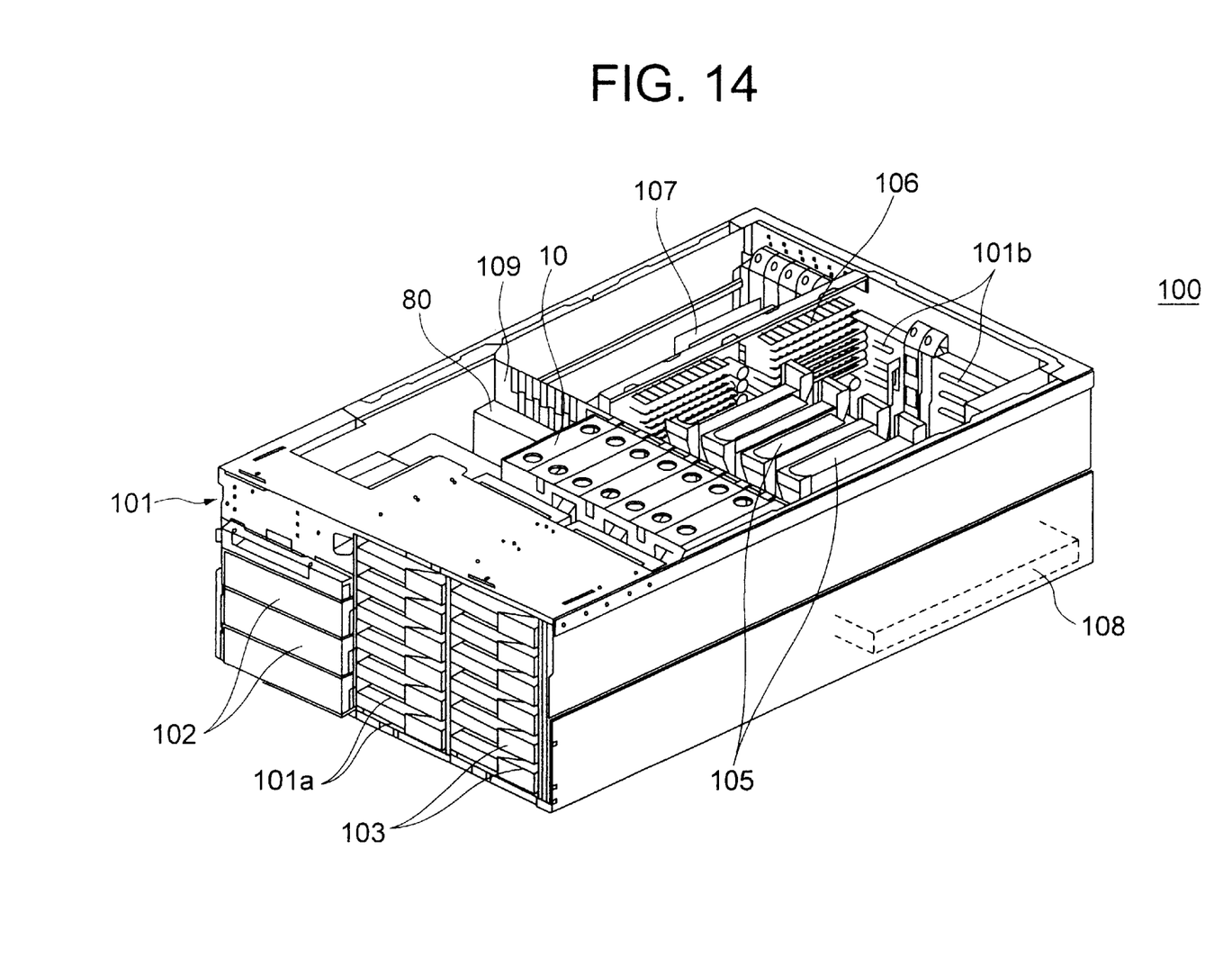
FIG. 14 is a perspective view showing the constructive example of the data processing apparatus in an assembled condition according to the embodiment of the present invention.

Next, with reference to FIGS. 13 and 14, the construction of a data processing apparatus mounting the cooling apparatus of this embodiment having the construction as described above will be described. FIGS. 13 and 14 show a state that a not-shown casing cover has been removed and the interior of the casing is visible.

As exemplified in FIGS. 13 and 14, the data processing apparatus 100 of this embodiment is made up from a casing 101, a plurality of fixed disk units 102 and fixed disk units 103 mounted in an opening portion at one end of this casing 101 so as to be able to be inserted/drawn out from the external, a mother board 104, a plurality of processor modules 105 and memory modules 106 and a I/O control module 107 mounted on the mother board 104, a power supply module 108 mounted on the lower side of the mother board 104, and so on.

In the casing 101, ventilation gaps 101a are provided between a plurality of fixed disk units 102 and fixed disk units 103 mounted so as to be able to be inserted/drawn out from the external. In the opposite surface where a plurality of processor modules 105 and so on are positioned, ventilation slits 101b are provided.

On each of the processor modules 105, a not-shown microprocessor is mounted. By an program loaded on the memory module 106 such as a main memory device, necessary data processing operation is performed.

The I/O control module 107 operates under the processor module 105 and performs control of input/output of data to a plurality of fixed disk units 102 and fixed disk units 103, and control of input/output of information between an external not-shown information network and further a user interface such as a display, a keyboard, a mouse, or the like.

The power supply module 108 supplies operation power to each section of a plurality of fixed disk units 102 and units 103, the mother board 104, a plurality of processor modules 105, the memory module 106, the I/O control module 107, the multi-blade fan 50 of the cooling apparatus, and so on.

In the data processing apparatus of this embodiment, a duct fixture frame 109 is provided at the center portion of the casing 101. As exemplified in FIGS. 1 to 5, the cooling apparatus 10 to which the cooling duct 70 and the cooling duct 80 are mounted on the exhaust main surface 22 side is mounted as shown in FIG. 14.

Figure 5:
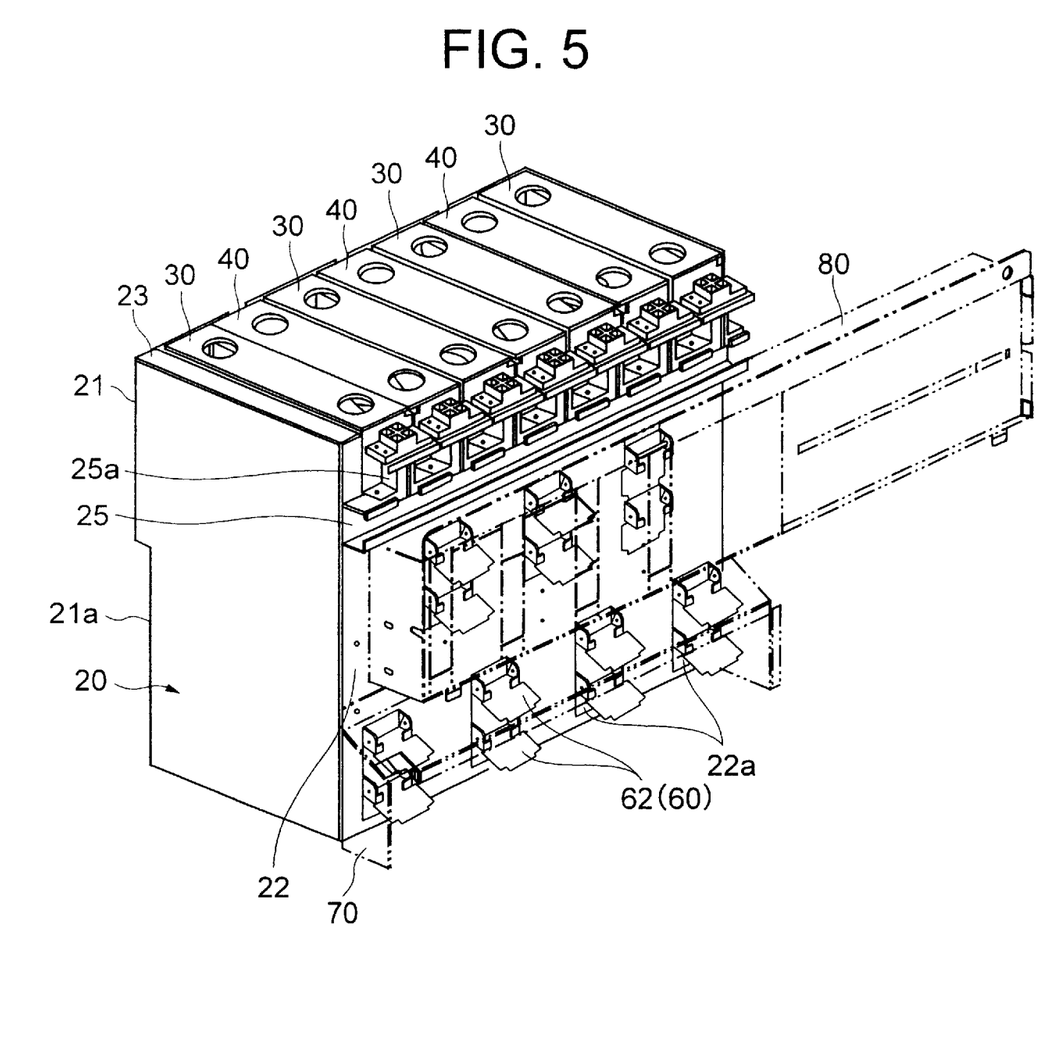
FIG. 5 is a perspective view showing an example of an assembly relation between the cooling apparatus and a cooling duct according to the present invention.
Figure 6:
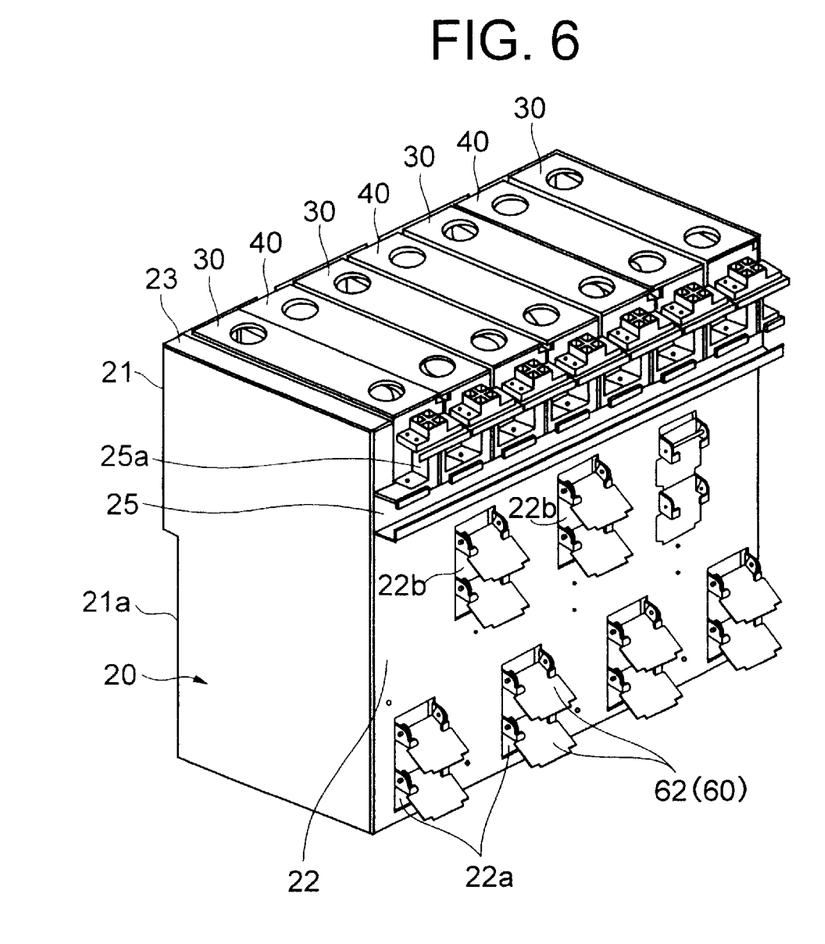
FIG. 6 is a perspective view showing the assembled condition of the embodiment of the cooling apparatus according to of the present invention.
Figure 7:
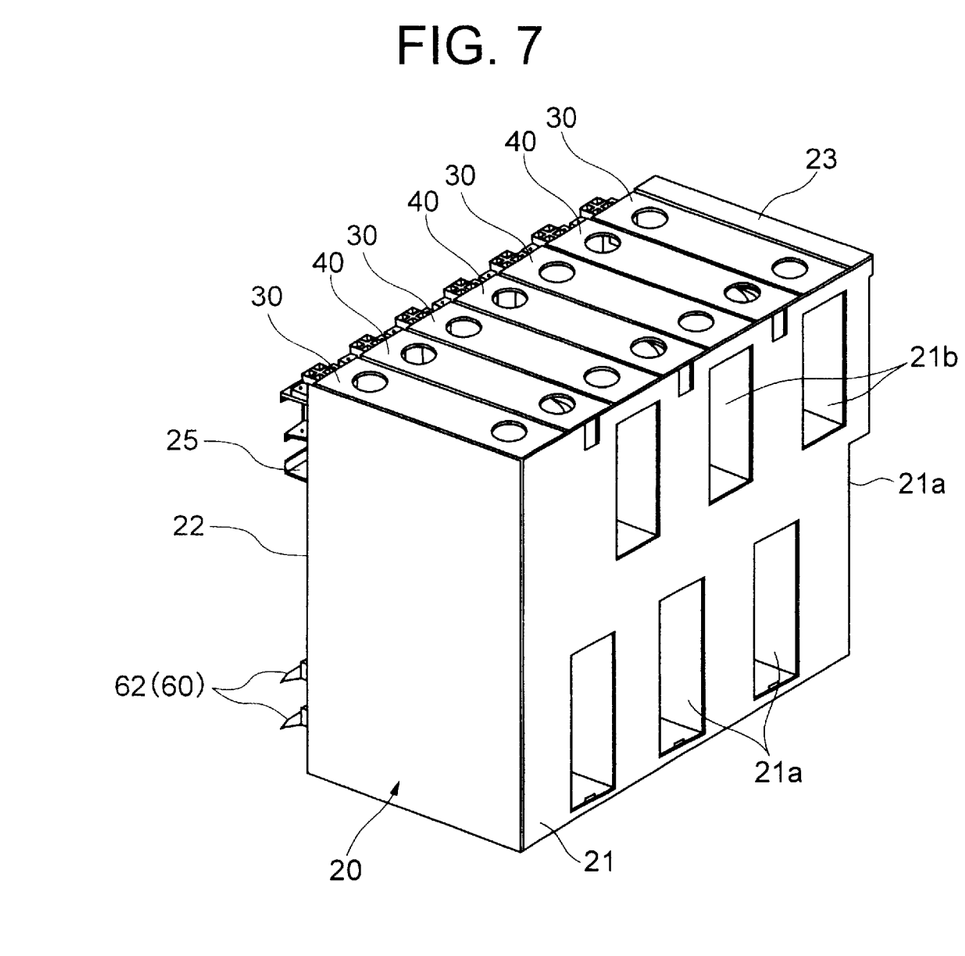
FIG. 7 is a perspective view showing the assembled condition seen from the opposite direction of FIG. 6.

That is, in case of this embodiment, as shown in FIG. 5, the cooling duct 70 and the cooling duct 80 are disposed so as to be supported by the duct fixture frame 109. The cooling apparatus 10 is disposed so that four exhaust openings 22a on the lower side of the exhaust main surface 22 are connected to the cooling duct 70 and three exhaust openings 22b on the upper side are connected to the cooling duct 80. Further, the exhaust main surface 22 of the cooling apparatus 10 faces the processor module 105 or the like side. The cooling apparatus 10 is mounted at the center portion of the casing 101 so that the suction main surface is in a posture to face a plurality of fixed disk units 102 and fixed disk units 103 side.

In the attachment structure of this cooling apparatus, as exemplified in FIG. 14, since the insertion/drawn-out working hole 34 and the insertion/drawn-out working hole 44 of each of a plurality of fan units 30 and 40 constituting the cooling apparatus 10 are exposed to the external when a not-shown casing cover has been removed out, insertion/drawn-out operation of individual fan units 30 and 40 is easily possible.

Since the cooling apparatus of this embodiment, as described above, can realize a large cooling ability by the concentrated disposition of a plurality of multi-blade fans 50 in a smaller apparatus volume, the occupying ratio of the volume of the cooling apparatus 10 in the interior of the casing 101 of the data processing apparatus 100 can be reduced, and a reduction of the size of the casing 101 can be realized.

The cooling duct 70 introduces air flows discharged from a plurality of exhaust openings 22a to the power supply module 108 positioned on the lower side of the mother board 104. The cooling duct 80 allows an air flow discharged from the exhaust opening 22b to branch to flow into a slit 81 and a slit 82, and introduces them to the region where the processor module 105 and the memory module 106 are positioned and the region where the I/O control module 107 is positioned, respectively. In the cooling duct 80, by changing the ratio between the opening areas of the slit 81 and the slit 82, the cooling ability in the branched destinations of the air flows can be arbitrarily changed. Besides, also in the cooling duct 70 and the cooling duct 80, the cooling ability by each cooling duct can be arbitrarily changed by the number of exhaust openings 22a and exhaust openings 22b belonging to respective ducts.

In this embodiment, the number of fan units 30 and 40 in the cooling apparatus 10 is set so that the cooling ability has a large margin with respect to the heat generation rate in the casing 101 of the data processing apparatus, and even if the multi-blade fan 50 of one fan unit 30 or 40 is stopped, for example, there is no hindrance for operation continuance of the data processing apparatus 100.

Hereinafter, an example of operation of the data processing apparatus 100 of this embodiment will be described.

By supplying power to the data processing apparatus 100, a plurality of multi-blade fans 50 of the fan units 30 and 40 in the cooling apparatus 10 starts to operate, and air in the casing 101 is sucked from a plurality of suction openings 21a and suction openings 21b on the suction main surface 21 side of the cooling apparatus 10, and discharged into the cooling duct 70 and the cooling duct 80 of the exhaust main surface 22.

By this construction, an air flow which flows in the casing from the ventilation gap 101a side between a plurality of fixed disk units 102 and fixed disk units 103, passes through the power supply module 108 and mother board 104, a plurality of processor modules 105, the memory module 106, and the I/O control module 107, and gets away to the ventilation slit 10b on the opposite side is constantly formed within the casing 101 of the data processing apparatus 100. The air flow cools a plurality of fixed disk units 102 and fixed disk units 103, the power supply module 108, the mother board 104, the processor module 105, the memory module 106, the I/O control module 107, and so on.

During the operation of the data processing apparatus 100, even if the multi-blade fans 50 of some excess fan units 30 and 40 of the cooling apparatus 10 are stopped, as described above, the reduction of the cooling ability of the cooling apparatus 10 is suppressed within the ability of a stopping excess multi-blade fan 50 by the operation of the check valve 60, and a rapid reduction of the whole cooling ability of the cooling apparatus 10 caused by the circulation of the exhaust air flow in the fan units 30 and 40 in the trouble portion can be prevented.

Besides, by monitoring the presence/absence of each power supply to a plurality of power supply connectors 25a provided on the terminal table 25 of the cooling apparatus on the power supply module 108 side, the multi-blade fan 50 which is out of order can be easily specified.

Besides, in a maintenance operation, when an arbitrary fan unit 30 or 40 is exchanged, the whole cooling ability of the cooling apparatus is never reduced by the check operation of the check valve 60 to the drawn-out fan unit 30 or 40, and an arbitrary fan unit 30 and 40 can be exchanged while keeping a continuous operation of the data processing apparatus 100.

Besides, when the check valve 60 of the cooling apparatus 10 has the construction of FIG. 11, the data processing apparatus 100 can be operated even if the apparatus is rotated by 90 degrees from a posture exemplified in FIG. 13 around the axis in a flowing direction of a suction air flow and an exhaust air flow formed in the cooling apparatus 10. Besides, when the check valve 60 of the cooling apparatus 10 has the construction of FIG. 12, the data processing apparatus 100 can be operated in any posture.

As a result, it becomes possible to realize a long-term nonstop operation of the data processing apparatus 100. Besides, it becomes possible that the data processing apparatus 100 is operated in various disposed postures.

In the above, the invention made by the present inventor has been specifically described on the basis of the embodiments. However, it is needless to say that the present invention is not limited to the above embodiments and can be variously changed within the scope not deviating its gist.

For example, the above embodiment describes an example in which the check valve 60 is disposed on the exhaust opening 22a (22b) side. However, it is also possible to construct the embodiment so that the check valve is disposed on the suction opening 21a (21b) side.

Besides, the data processing apparatus 100 is not limited to the construction exemplified in the above-described embodiment. For example, a construction in which only a plurality of fixed disk units 102 and fixed disk units 103 and the power supply module 108 for operating these are mounted within the casing 101 together with the cooling apparatus 10 may be possible. Alternatively, a construction of the data processing apparatus 100, in which only a plurality of I/O control modules 107 and the power supply module 108 for operating these are mounted within the casing 101 together with the cooling apparatus 10 may be possible.

The data processing apparatus according to the present invention is not limited to that having the construction exemplified in the above-described embodiment, but can be applied to a forced cooling technique for a data processing apparatus having any construction.

According to the cooling apparatus of the present invention, it is possible to provide an effect that the cooling ability is enhanced by a concentrated disposition of a plurality of multi-blade fans within a smaller disposition space.

According to the cooling apparatus of the present invention, it is possible to provide an effect that a considerable reduction of the cooling ability is suppressed even if a specific multi-blade fan in a concentrated arrangement of a plurality of multi-blade fans which is always operated stops.

According to the cooling apparatus of the present invention, it is possible to provide an effect that any multi-blade fan in the cooling apparatus comprising a plurality of multi-blade fans can be exchanged without stopping the operation of the cooling apparatus and without considerably reducing the cooling ability.

According to the cooling apparatus of the present invention, it is possible to provide an effect that, any multi-blade fan in the cooling apparatus comprising a plurality of multi-blade fans can be exchanged irrespective of the installed posture of the cooling apparatus.

According to the data processing apparatus of the present invention, it is possible to provide an effect that the size of the whole casing including the cooling apparatus is reduced.

According to the data processing apparatus of the present invention, it is possible to provide an effect that the apparatus can be continuously operated irrespective of a maintenance work of the cooling apparatus.

What is claimed is:

1. A cooling method for an electrical device comprising the steps of:
   disposing a plurality of multi-blade fans in parallel so that a suction opening of each multi-blade fan faces toward the suction opening of an adjacently arranged multi-blade fan; and
   connecting an exhaust opening of each multi-blade fan to a partition wall for dividing a suction side of the multi-blade fans from an exhaust side thereof.

2. The method according to claim 1, further comprising the steps of:
   providing a check valve in at least one of a suction flow passage and an exhaust flow passage of each multi-blade fan;
   connecting a duct to the exhaust side of the partition wall; and
   closing a valve body of the check valve by use of an internal pressure in the duct when the corresponding multi-blade fan stops, so that the check valve autonomously prevents the air from flowing from the exhaust opening to the suction opening by closing the suction flow passage or the exhaust flow passage when the corresponding multi-blade fan stops.

3. The method according to claim 1, further comprising the steps of:
   providing a check valve in at least one of a suction flow passage and an exhaust flow passage of each multi-blade fan; and
   closing a valve body of the check valve by use of its own weight when the corresponding multi-blade fan stops, so that the check valve autonomously prevents the air from flowing from the exhaust opening to the suction opening by closing the suction flow passage or the exhaust flow passage when the corresponding multi-blade fan stops.

4. The method according to claim 1, further comprising the steps of:
   providing a check valve in at least one of a suction flow passage and an exhaust flow passage of each multi-blade fan;
   continuously providing a biasing force on a valve body of the check valve so as to close the valve body;
   opening the valve body by use of a dynamic pressure of the suction air flow or the exhaust air flow against the biasing force when the multi-blade fan is operated; and
   closing the valve body by use of the biasing force when the multi-blade fan stops, so that the check valve autonomously prevents the air from flowing from the exhaust opening to the suction opening by closing the suction flow passage or the exhaust flow passage when the corresponding multi-blade fan stops.

5. A cooling apparatus comprising:
   a plurality of multi-blade fans disposed in parallel so that a suction opening of each multi-blade fan faces toward the suction opening of an adjacently arranged multi-blade fan; and
   a partition wall dividing a suction side of the multi-blade fan from an exhaust side thereof.

6. The apparatus according to claim 5, further comprising:
   a check valve disposed in at least one of a suction flow passage and an exhaust flow passage of each multi-blade fan, the check valve comprising a valve body which moves freely within an acute rotational range between an open position and a closed position; and
   a duct connected to the exhaust side of the partition wall, wherein
      the valve body of the check valve is closed by an internal pressure in the duct when the corresponding multi-blade fan stops, so that the check valve autonomously prevents the air from flowing from the exhaust opening to the suction opening by closing the suction flow passage or the exhaust flow passage when the corresponding multi-blade fan stops.

7. The apparatus according to claim 5, further comprising:
   a check valve disposed in at least one of a suction flow passage and an exhaust flow passage of each multi-blade fan, the check valve comprising a valve body which moves freely between an open position and a closed position, wherein
      the valve body of the check valve is closed by its own weight when the corresponding multi-blade fan stops, so that the check valve autonomously prevents the air from flowing from the exhaust opening to the suction opening by closing the suction flow passage or the exhaust flow passage when the corresponding multi-blade fan stops.

8. The apparatus according to claim 5, further comprising:
   a check valve disposed in at least one of a suction flow passage and an exhaust flow passage of each multi-blade fan, the check valve comprising a valve body which moves freely between an open position and a closed position; and
   biasing means for continuously providing a biasing force on the valve body so as to close the valve body, wherein
      the valve body of the check valve is opened by a dynamic pressure of the suction air flow or the exhaust air flow against the biasing force when the multi-blade fan is operated, and closed by the biasing force when the corresponding multi-blade fan stops, so that the check valve autonomously prevents the air from flowing from the exhaust opening to the suction opening by closing the suction flow passage or the exhaust flow passage when the corresponding multi-blade fan stops.

9. A data processing apparatus comprising:
   a first casing;
   at least an external storage unit and a power supply unit mounted within the first casing; and
   a cooling apparatus mounted within the first casing, comprising a plurality of multi-blade fans disposed in parallel so that a suction opening of each multi-blade fans is in opposition to the suction opening of an adjacently arranged multi-blade fan, and a partition wall dividing a suction side of the multi-blade fan from an exhaust side thereof.

* * * * *